United States Patent
Lin et al.

(10) Patent No.: US 6,204,107 B1
(45) Date of Patent: Mar. 20, 2001

(54) METHOD FOR FORMING MULTI-LAYERED LINER ON SIDEWALL OF NODE CONTACT OPENING

(75) Inventors: Kuo-Chi Lin, Lur-Chou; Kuen-Yow Lin, Chia-Yi; Chien-Hua Tsai, Taichung; Kun-Chi Lin, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/208,611

(22) Filed: Dec. 8, 1998

(51) Int. Cl.⁷ .................................................. H01L 21/8234
(52) U.S. Cl. ..................... 438/238; 438/230; 438/280; 438/622; 438/626; 437/195; 156/657.1
(58) Field of Search ................................ 438/238, 622, 438/626, 230, 280; 437/195; 156/657.1

(56) References Cited

U.S. PATENT DOCUMENTS

| | | | |
|---|---|---|---|
| 4,826,786 | * 5/1989 | Merenda et al. | 437/195 |
| 5,015,592 | * 5/1991 | Moldovan | 437/4 |
| 5,663,102 | * 9/1997 | Park | 438/626 |
| 5,677,243 | * 10/1997 | Ohsaki | 437/195 |
| 5,700,349 | * 12/1997 | Tsukamoto et al. | 156/657.1 |
| 6,060,383 | * 5/2000 | Nogami et al. | 438/622 |

\* cited by examiner

Primary Examiner—Richard Elms
Assistant Examiner—Pho Luu
(74) Attorney, Agent, or Firm—Charles C. H. Wu; Charles C. H. Wu & Associates, APC

(57) ABSTRACT

A method for forming a multi-layered liner on the sidewalls of a node contact opening includes the steps of providing a substrate having a dielectric layer thereon. The dielectric layer further includes a node contact opening that exposes a portion of the substrate. A first liner layer is then formed on the sidewalls of the node contact opening. Next, a second liner layer is formed over the first liner layer such that the first liner layer and the second liner layer together form a dual-layered liner. The first liner layer in contact with the dielectric layer has good insulation capacity while the second liner layer has good etch-resisting property.

22 Claims, 2 Drawing Sheets

METHOD FOR FORMING MULTI-LAYERED LINER ON SIDEWALL OF NODE CONTACT OPENING

BACKGROUND OF THE INVENTION

1. Field of Invention

The present invention relates to a method of manufacturing integrated circuits. More particularly, the present invention relates to a method for forming a multi-layered liner on the sidewalls of a node contact opening.

2. Description of Related Art

As semiconductor fabrication moves towards the manufacture of devices having line width under 0.25µm, width of a word line, a bit line and a contact node opening as well as their distances of separation from each other in DRAM must be reduced according to the design rules. Due to a shorter distance between neighboring bit lines, alignment accuracy of a node contact opening is worse than before. To prevent too much parasitic capacitance between the bit line and the node contact due to lower alignment accuracy, an insulating liner is normally formed on the sidewalls of the node contact opening. In fact, the liner is able to provide the necessary insulation between the subsequently formed node contact and the bit line.

In general, the liner is either a silicon oxide layer or a silicon nitride layer. FIG. 1 is a schematic, cross-sectional view showing a conventional node contact opening having a liner layer. As shown in FIG. 1, the node contact opening structure is built upon a substrate 100 (for simplicity, devices within the substrate 100 are not drawn). The structure includes two dielectric layers 108 and 110 above the substrate 100, bit lines 106 embedded within the dielectric layer 110, a node contact opening 102 passing through the dielectric layers 110 and 108 to expose a portion of the substrate 100, and a liner layer 104 on the sidewalls of the node contact opening 102. The liner layer 104 is formed by depositing a conformal insulating layer (not shown) over the dielectric layer 110 as well as the interior sidewalls and bottom of the node contact opening 102. Next, the insulating layer is etched back to remove the insulating layer above the dielectric layer 110 and the insulating layer at the bottom 102a of the node contact opening 102. The remaining insulating layer on the sidewalls of the node contact opening 102 after the etching operation becomes the liner layer 104.

Although silicon oxide liner 104 can provide good insulation, it can be easily damaged by diluted hydrofluoric acid. Diluted hydrofluoric acid is used for removing native oxide layer above the substrate before the node contact is formed. Therefore, a portion of the silicon oxide of the liner layer 104 may be etched away.

Normally a thicker oxide liner layer is formed to prevent the removal of too much silicon oxide from the liner layer 104 by hydrofluoric acid. However, by so doing, a thicker layer of oxide is also laid over the bottom part 102a of the node contact opening 102. Therefore, time required to etch away the entire oxide layer at the bottom 102a of the node contact opening 102 is longer. A longer etching time not only leads to the removal of extra oxide from the top portion 102b of the node contact opening 102, but also leads to the removal of oxide on the sidewall, as well.

Alternatively. silicon nitride can also be used to form the liner layer 104. Although silicon nitride liner is more resistant to the attack by hydrofluoric acid than silicon oxide liner, silicon nitride tends to have more pinholes. Therefore, the insulation capacity of a silicon nitride layer is inferior. Often, this leads to larger leakage current between the node contact and the bit line 106 resulting in electrical instability problems.

In light of the foregoing, there is a need to improve the liner layer on the sidewalls of a node contact opening.

SUMMARY OF THE INVENTION

Accordingly, the present invention provides a method for forming a multi-layered liner on the sidewalls of a node contact opening so that the corrosion of silicon oxide on the sidewalls of the node contact opening by hydrofluoric acid is minimized.

In another aspect, the invention provides a method for forming a multi-layered liner on the sidewalls of a node contact opening so that leakage current from the node contact to a neighboring bit line due to pin holes in a silicon nitride liner is reduced.

To achieve these and other advantages and in accordance with the purpose of the invention, as embodied and broadly described herein, the invention provides a method for forming a multi-layered liner on the sidewalls of a node contact opening. The method includes the steps of providing a substrate having a dielectric layer thereon, and then forming a node contact opening in the dielectric layer. Next, a first liner layer is formed over the sidewalls of the node contact opening, and then a second liner layer is formed over the first liner layer. A major aspect of this invention is the sequential formation of two or more liner layers on the sidewalls of a node contact opening. The first liner layer has good isolating capacity and very few pin holes so that parasitic capacitance and leakage current due to the relative closeness between the node contact and its neighboring bit line is very much reduced. The second liner layer has strong etching resistance, and therefore is capable of protecting the underlying first liner layer against a corrosive cleaning agent in subsequent cleaning operations.

In one further aspect, the invention also provides a node contact opening having a multi-layered liner structure. The structure includes a substrate, a dielectric layer over the substrate, a node contact opening within the dielectric layer that also exposes a portion of the substrate, a first liner layer on the sidewalls of the node contact opening and a second liner layer over the first liner layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
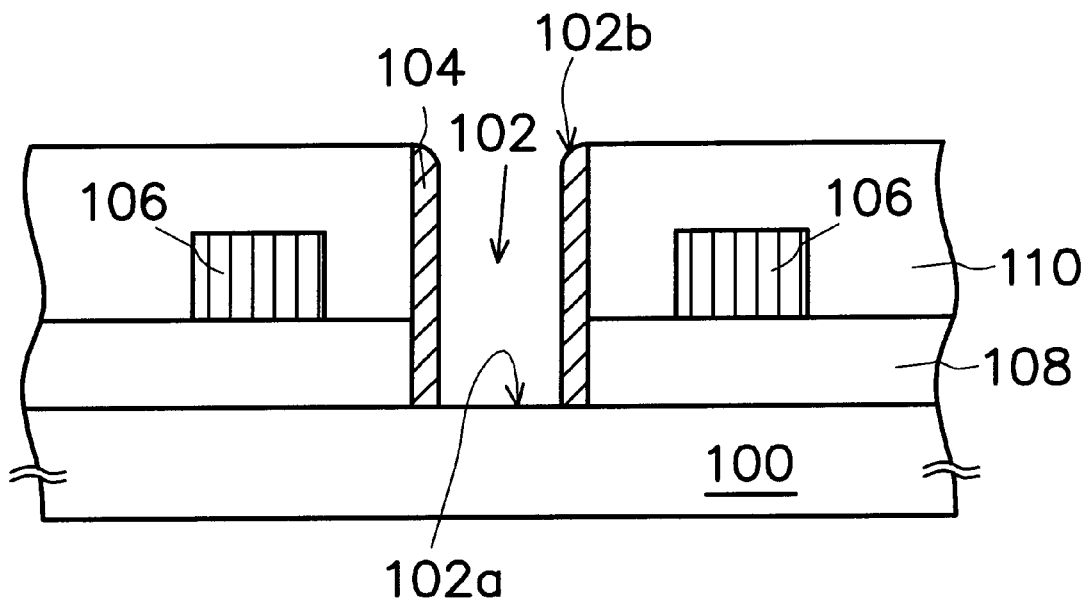
FIG. 1 is a schematic, cross-sectional view showing a conventional node contact opening having a liner layer.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
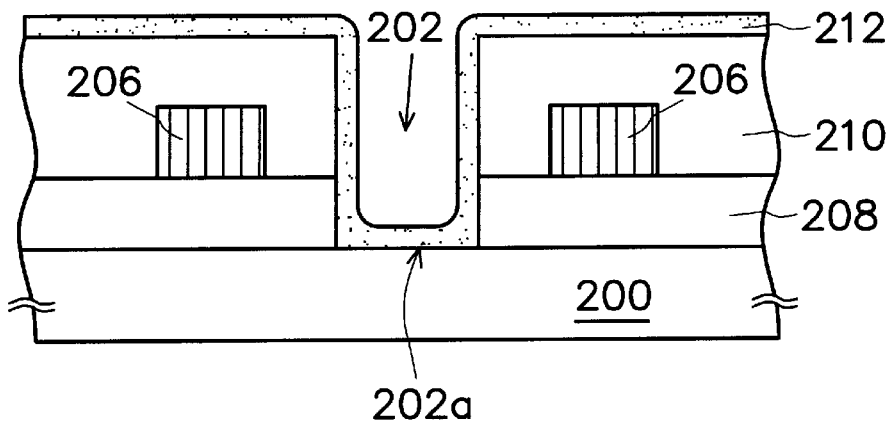
FIGS. 2A through 2C are schematic, cross-sectional views showing the progression of manufacturing steps in fabricating a node contact opening having a multi-layered liner structure according to one preferred embodiment of this invention.
Figure 2B:
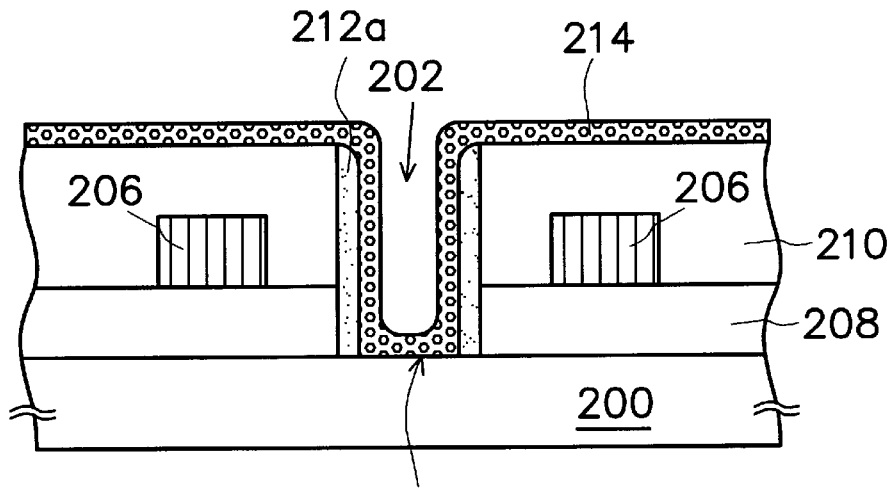
Figure 2C:
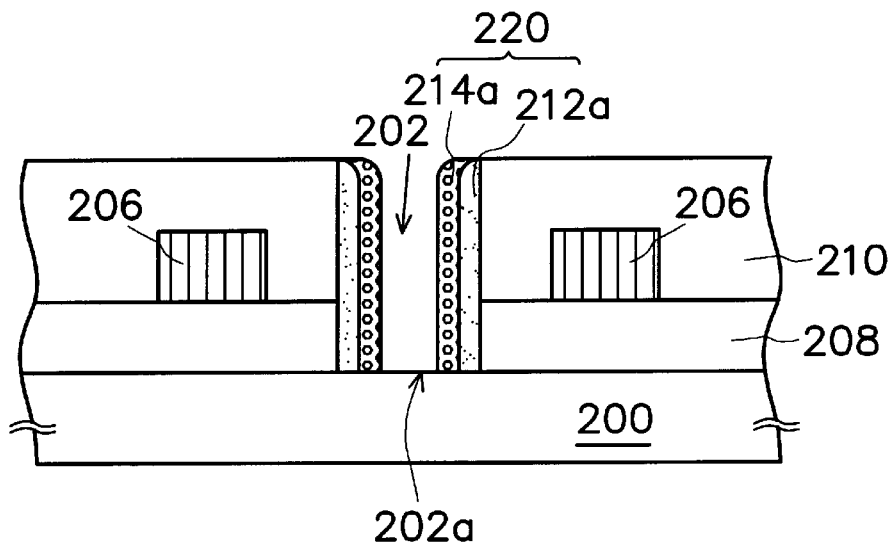

FIGS. 2A through 2C are schematic, cross-sectional views showing the progression of manufacturing steps in fabricating a node contact opening having a multi-layered liner structure according to one preferred embodiment of this invention.

First, as shown in FIG. 2A, a substrate 200 is provided. The substrate 200 has a dielectric layer 208, bit lines 206, a dielectric layer 210 and a node contact opening 202. The node contact opening 202 passes right through the dielectric layers 208 and 210 while positioned between two bit lines 206. Next, a first insulation layer 212 conformal to the dielectric layer 210 and the node contact opening 202 is formed. The first insulation layer 212 has good capacity for insulation and has few pinholes in it. Therefore, the first insulation layer 212 can prevent the formation of parasitic capacitance and leakage current between the subsequently formed node contact and the bit line 206. The first insulation layer 212 can be a silicon oxide layer or other layer having similar properties. The first insulation layer 212 can be formed using a low-pressure chemical vapor deposition (LPCVD) method, for example.

Next, as shown in FIG. 2B, the first insulation layer 212 over the dielectric layer 210 and at the bottom part 202a of the node contact opening 202 is removed to form a first liner layer 212a. The first insulation layer 212 can be removed using an anisotropic etching method. Preferably, the first insulation layer 212 is removed using carbon fluoride plasma in a dry etching operation. Thereafter, a second insulation layer 214 conformal to the dielectric layer 210 and the first liner layer 212a is formed. The second insulation layer 214 has special properties capable of resisting the etching action of corrosive cleaning agent. The second insulation layer 214 can be a silicon nitride layer or other layer having similar properties. The second insulation layer 214 can be formed using a low-pressure chemical vapor deposition (LPCVD) method, for example.

Subsequently, as shown in FIG. 2C, the second insulation layer 214 over the dielectric layer 210 and at the bottom part 202a of the node contact opening 202 is removed to form a second liner layer 214a. The second insulation layer 214 can be removed using an anisotropic etching method. Preferably, the second insulation layer 214 is removed using carbon fluoride plasma in a dry etching operation. The first liner layer 212a and the second liner layer 214a together constitute a two-layered liner 220 on the sidewalls of the node contact opening 202.

In the embodiment described using FIGS. 2A through 2C, the first liner layer 212a is formed first, followed by the deposition of a second liner layer 214a over the first liner layer 212a. In practice, two or more liner layers can be deposited to form a multi-layered liner over the node contact opening. Moreover, the dual-liner layer 220 can be formed by an alternate method of depositing the first insulation layer 212 and then the second insulation layer 214 in sequence, and then etching to remove the insulation layers above the dielectric layer 210 and at the bottom of the node contact opening 202.

The two-layered liner 220, composed of the first liner 212a and the second liner 214a (as shown in FIG. 2C), is a major innovation in this invention. Since the liner layer 214a has good resistance against corrosive cleaning agents, the liner layer 214a is able to protect the inner liner layer 212a. Meanwhile, since the liner layer 212a has good capacity for insulation and few pin holes, the liner layer 212a is able to reduce parasitic capacitance and leakage current, both of which may lead to electrical instability in the device.

In summary, major advantages of the invention includes:

b 1. The multi-layered liner on the sidewalls of the node contact opening is capable of resisting attack by corrosive cleaning agent. Hence, damaging effects such as the one on conventional silicon oxide liner is greatly reduced.

2. The multi-layered liner on the sidewalls of the node contact opening is capable of reducing leakage current between node contact and bit line due to microscopic pin holes when silicon nitride liner is used. Hence, electrical instability in the device is minimized considerably.

3. The method used in fabricating the multi-layered liner is compatible with semiconductor production procedure. Hence, the invention can be assimilated into the production line with ease.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a multi-layered liner on the sidewalls of a node contact opening comprising the steps of:

providing a substrate having a dielectric layer thereon, wherein the dielectric layer further includes a node contact opening that exposes a portion of the substrate;

forming a first liner layer on the sidewalls of the node contact opening; and forming a second liner layer over the first liner layer.

2. The method of claim 1, wherein the first liner layer has good isolation capacity and has a plurality of pinholes.

3. The method of claim 1, wherein the step of forming the first liner layer includes growing silicon oxide on the sidewalls of the node contact opening using low-pressure chemical vapor deposition.

4. The method of claim 3 wherein the step of forming the second liner layer includes depositing silicon nitride over the first liner layer using low-pressure chemical vapor deposition.

5. The method of claim 1, wherein the step of forming the first liner layer further includes performing an anisotropic etching operation.

6. The method of claim 1, wherein the second liner layer has high etching resistance.

7. The method of claim 1 wherein the step of forming the second liner layer includes depositing silicon nitride over the first liner layer using low-pressure chemical vapor deposition.

8. The method of claim 1, wherein the step of forming the second liner layer further includes performing an anisotropic etching operation.

9. A method for forming a multi-layered liner on the sidewalls of a node contact opening, comprising the steps of:

providing a substrate having a node contact opening thereon;

forming an insulating liner layer on the sidewalls of the node contact opening; and forming an etch-resistant liner layer over the insulating liner layer.

10. The method of claim 9, wherein the step of forming the insulating liner layer includes growing silicon oxide on the sidewalls of the node contact opening using low-pressure chemical vapor deposition.

11. The method of claim 10, wherein the step of forming the etch-resistant liner layer includes depositing silicon nitride over the insulating liner layer using low-pressure chemical vapor deposition.

12. The method of claim 9, wherein the step of forming the insulating liner layer further includes performing an anisotropic etching operation.

13. The method of claim 9, wherein the step of forming the etch-resistant liner layer includes depositing silicon nitride over the insulating liner layer using low-pressure chemical vapor deposition.

14. The method of claim 9, wherein the step of forming the etch-resistant liner layer further includes performing an anisotropic etching operation.

15. A node contact opening having a multi-layered liner structure, comprising:
   a substrate;
   a dielectric layer above the substrate, wherein the dielectric layer has a node contact opening that exposes a portion of the substrate;
   a first liner layer on the sidewalls of the node contact opening; and
   a second liner layer over the first liner layer.

16. The structure of claim 15, wherein the first liner layer includes a silicon oxide layer.

17. The structure of claim 16, wherein the second liner layer includes a silicon nitride layer.

18. The structure of claim 15, wherein the second liner layer includes a silicon nitride layer.

19. A node contact opening having a multi-layered liner structure, comprising:
   a substrate;
   a dielectric layer above the substrate, wherein the dielectric layer has a node contact opening that exposes a portion of the substrate;
   an insulating liner layer on the sidewalls of the node contact opening; and
   an etch-resistant liner layer over the insulating liner layer.

20. The structure of claim 19, wherein the insulating liner layer includes a silicon oxide layer.

21. The structure of claim 20, wherein the etch-resistant liner layer includes a silicon nitride layer.

22. The structure of claim 19, wherein the etch-resist liner layer includes a silicon nitride layer.

* * * * *